United States Patent
Yoshida

(10) Patent No.: US 10,206,281 B2
(45) Date of Patent: Feb. 12, 2019

(54) MULTILAYER SUBSTRATE

(71) Applicant: Onkyo Corporation, Osaka (JP)

(72) Inventor: Makoto Yoshida, Osaka (JP)

(73) Assignee: Onkyo Corporation, Osaka (JP)

( * ) Notice: Subject to any disclaimer, the term of this patent is extended or adjusted under 35 U.S.C. 154(b) by 0 days.

(21) Appl. No.: 15/840,598

(22) Filed: Dec. 13, 2017

(65) Prior Publication Data

US 2018/0177040 A1    Jun. 21, 2018

(30) Foreign Application Priority Data

Dec. 20, 2016  (JP) .................................. 2016-246430

(51) Int. Cl.
| | |
|---|---|
| H05K 1/11 | (2006.01) |
| H05K 1/02 | (2006.01) |
| H05K 9/00 | (2006.01) |

(52) U.S. Cl.
CPC ........... *H05K 1/115* (2013.01); *H05K 1/0215* (2013.01); *H05K 1/0216* (2013.01); *H05K 1/0225* (2013.01); *H05K 1/0259* (2013.01); *H05K 9/006* (2013.01); *H05K 9/0039* (2013.01); *H05K 2201/093* (2013.01); *H05K 2201/09327* (2013.01); *H05K 2201/09354* (2013.01)

(58) Field of Classification Search
CPC .... H05K 1/115; H05K 1/0215; H05K 1/0225; H05K 1/0259
See application file for complete search history.

(56) References Cited

U.S. PATENT DOCUMENTS

| | | | | |
|---|---|---|---|---|
| 2005/0098348 A1* | 5/2005 | Okumichi | ......... | H01L 23/49827 174/262 |
| 2011/0000707 A1 | 1/2011 | Kawai | | |

FOREIGN PATENT DOCUMENTS

| | | |
|---|---|---|
| JP | H07-273468 A | 10/1995 |
| JP | 2000-164999 | 6/2000 |
| JP | 2003-297969 A | 10/2003 |
| JP | 2005-019730 A | 1/2005 |
| JP | 2011-014692 | 1/2011 |

OTHER PUBLICATIONS

Extended European Search Report for corresponding App. No. 17205638.4, dated May 15, 2018.

* cited by examiner

*Primary Examiner* — Jeremy C Norris
(74) *Attorney, Agent, or Firm* — Renner Otto Boisselle & Sklar, LLP

(57) ABSTRACT

A multilayer substrate includes plural layers of circuit patterns. Each circuit pattern includes a ground conductor surrounding a wiring region provided with a conductive wiring pattern. Each ground conductor includes a slit connecting between the outside of the multilayer substrate and the wiring region. In the multilayer substrate, the slit of the ground conductor provided at one of adjacent two layers of the circuit patterns and the slit of the ground conductor provided at the other circuit pattern are formed at positions not overlapping with each other. That is, these slits are formed at such positions that a view in an upper-to-lower direction is blocked. The shape of the slit of each ground conductor is in such a shape that a view from an end side of the multilayer substrate to a wiring region side is blocked.

4 Claims, 7 Drawing Sheets

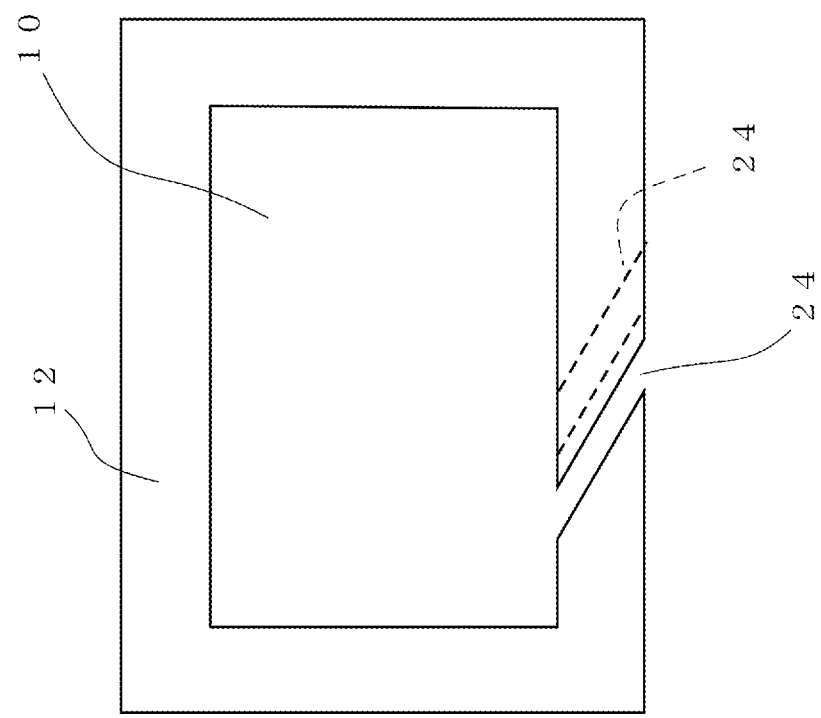

MULTILAYER SUBSTRATE

BACKGROUND OF THE INVENTION

1. Field of the Invention

The present invention relates to a multilayer substrate, and specifically relates to a ground conductor structure provided at each layer.

2. Description of the Related Art

Mobile information terminals such as a smartphone and a tablet computer have been broadly used. The mobile information terminal includes electronic circuits such as a processor, a wireless communication circuit, and an audio circuit. For reducing electric or magnetic interference among these electronic circuits, these electronic circuits are separately mounted on individual substrates, or are grounded to individual ground conductors. Moreover, for protecting electronic components from static electricity, the ground conductor provided at the substrate is sometimes in a shape surrounding a region where the electronic components are mounted. For example, in a case where a factory worker uses one's hands to deliver the substrate, the worker holds the ground conductor to protect the electronic components from the charged hands.

A multilayer substrate is often used as the substrate on which each electronic circuit is mounted. The multilayer substrate is configured such that plural layers of circuit patterns using conductors are stacked on each other. An insulator layer is provided between adjacent layers of the circuit patterns. Moreover, these different layers are electrically connected together through a via hole as a cylinder formed of a conductor. JP-A-2000-164999 and JP-A-2011-014692 described below disclose a technique relating to the multilayer substrate.

When the region where the electronic circuit is mounted is surrounded by the ground conductor for protecting the electronic components from static electricity, the ground conductor is in a loop shape. When noise electromagnetic waves reach this loop-shaped ground conductor, induced electromotive force is generated at the ground conductor, and therefore, noise current flows through the ground conductor. For this reason, noise voltage is generated at the electronic circuit connected to the ground conductor, or noise current flows through such an electronic circuit. In a case where the electronic circuit is an audio circuit configured to output an audio signal to earphones or a speaker, noise is output from the earphones or the speaker.

SUMMARY OF THE INVENTION

An objective of the present invention is to provide a substrate configured to protect electronic components from static electricity and to be less susceptible to noise influence.

The present invention relates to a multilayer substrate with plural layers of circuit patterns. The multilayer substrate includes a ground conductor provided at each circuit pattern and surrounding a wiring region provided with a conductive wiring pattern, and a missing portion provided at the ground conductor of each circuit pattern and connecting between the outside of the multilayer substrate and the wiring region. The missing portion of the ground conductor provided at one of adjacent two layers of the circuit patterns and the missing portion of the ground conductor provided at the other layer are formed at positions not overlapping with each other.

Preferably, the missing portion of the ground conductor provided at one of adjacent two layers of the circuit patterns and the missing portion of the ground conductor provided at the other layer are provided with such a distance that no interlayer connection path is provided between the missing portions.

Preferably, the multilayer substrate further includes an interlayer connection path provided in a region in the vicinity of the missing portion of each ground conductor, the region being not sandwiched between the missing portion of the ground conductor provided at one of adjacent two layers of the circuit patterns and the missing portion of the ground conductor provided at the other layer.

Preferably, the shape of the missing portion of the ground conductor provided at each circuit pattern is such a shape that a view from an end side of the multilayer substrate to a wiring region side is blocked.

According to the present invention, a substrate can be realized, which is configured to protect electronic components from static electricity and to be less susceptible to noise influence.

BRIEF DESCRIPTION OF THE DRAWINGS

FIG. 7 is a view of another example of the slit.

DETAILED DESCRIPTION OF THE PREFERRED EMBODIMENTS

Figure 1:
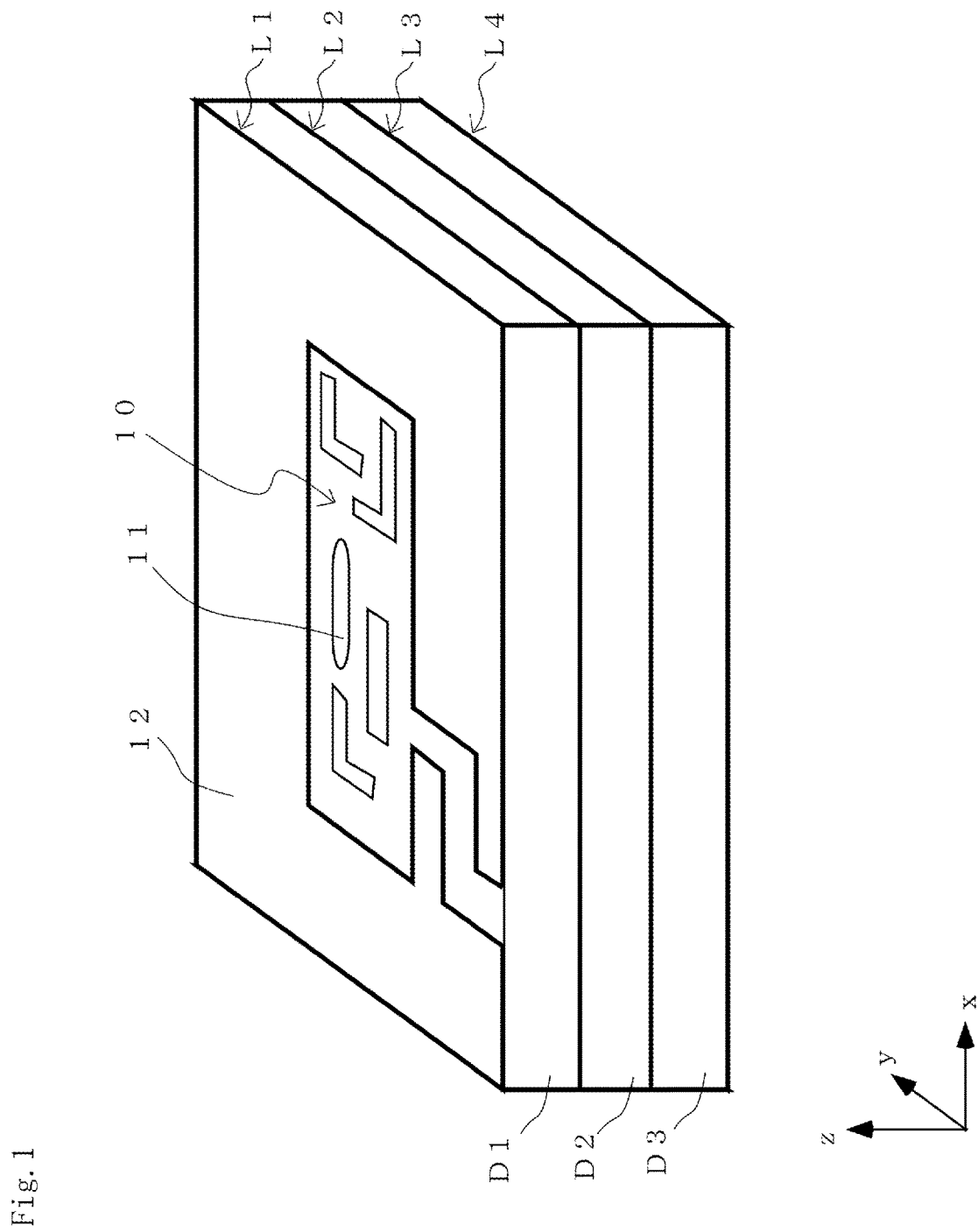
FIG. 1 is a view of a multilayer substrate of an embodiment of the present invention.

FIG. 1 illustrates a multilayer substrate of an embodiment of the present invention. The multilayer substrate has such a structure that a first layer circuit pattern L1 to a fourth layer circuit pattern L4 are stacked on each other. An insulator layer is provided between adjacent ones of the layers. That is, a first insulator layer D1 is provided between the first layer circuit pattern L1 and the second layer circuit pattern L2. Moreover, a second insulator layer D2 is provided between the second layer circuit pattern L2 and the third layer circuit pattern L3, and a third insulator layer D3 is provided between the third layer circuit pattern L3 and the fourth layer circuit pattern L4.

Each circuit pattern includes a wiring region 10 and a ground conductor 12 surrounding such a region. The wiring region 10 is provided with a conductive wiring pattern 11, the conductive wiring pattern 11 connecting among a plurality of electronic components. The electronic components are arranged in the wiring region 10 of the uppermost first layer circuit pattern L1, and are connected together through the conductive wiring pattern 11 to form an electronic circuit. Each of the wiring regions 10 of the second to fourth layer circuit patterns L2 to L4 may be provided with a conductive wiring pattern. According to an electronic circuit configuration, these different layers may be connected together through a via hole. The via hole is an interlayer connection path for connecting the circuit patterns of the different layers. For example, the via hole is formed in such a manner that a conductor is applied to a wall surface of a hole opening in a cylindrical shape. In addition to the via hole, a linear conductive wire may be used as the interlayer connection path.

Figure 2:
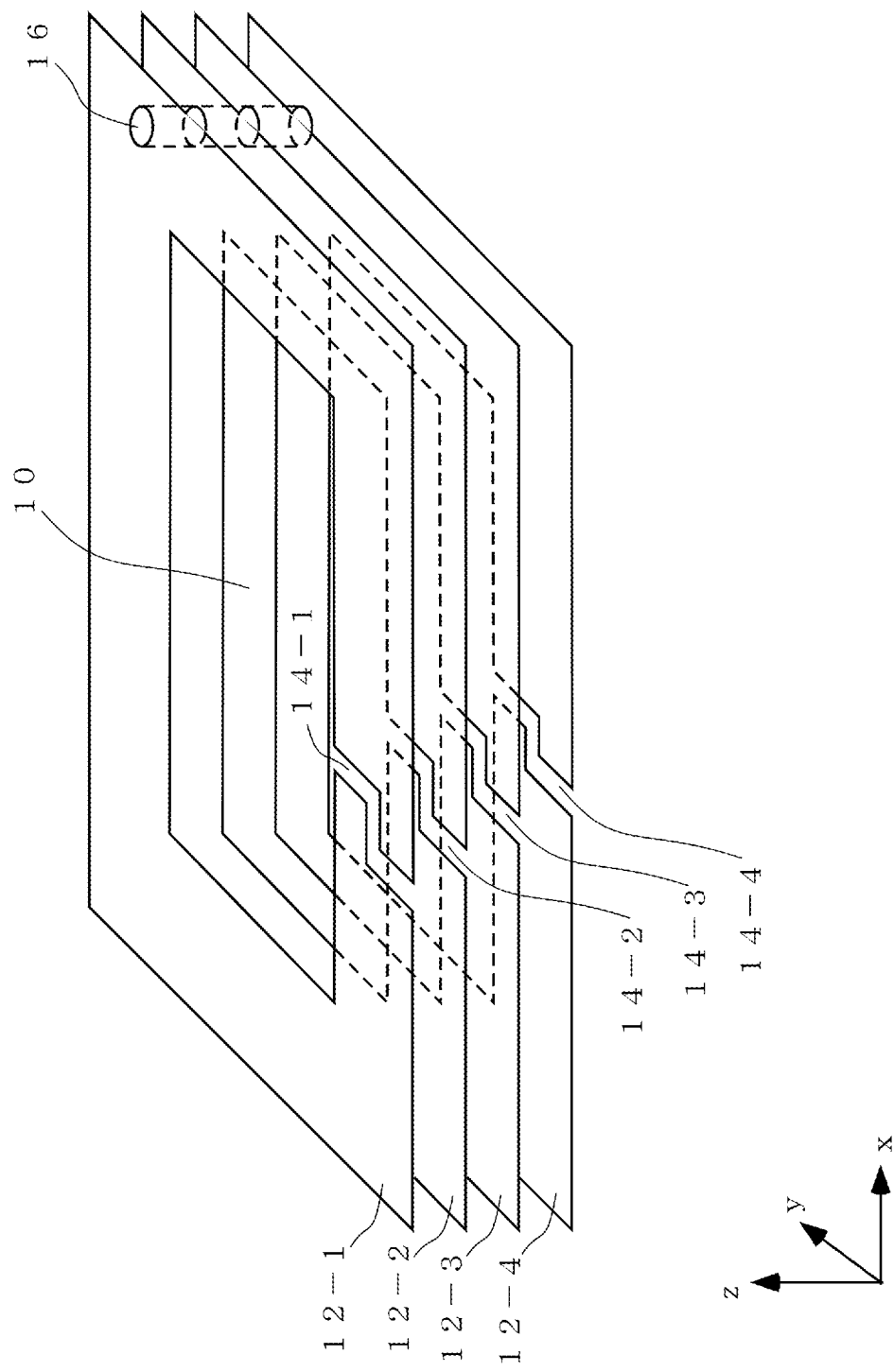
FIG. 2 is a view of a ground conductor structure provided at the multilayer substrate.
Figure 3A:
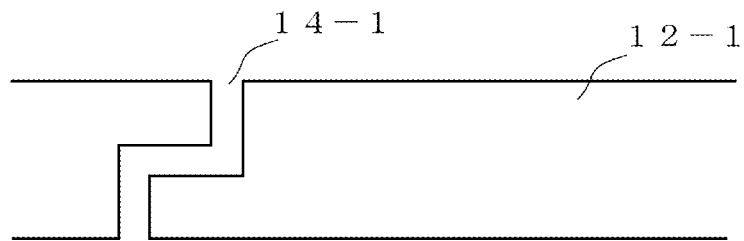
FIGS. 3A to 3D are schematic views of the position of each slit.
Figure 3B:
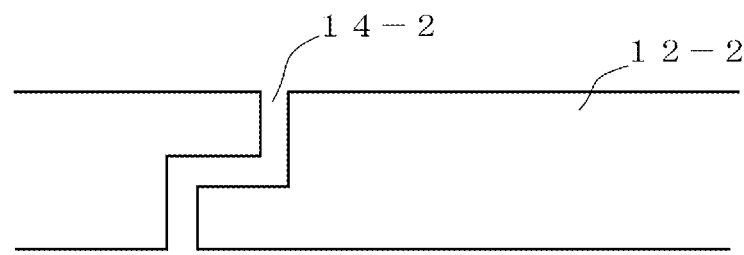
Figure 3C:
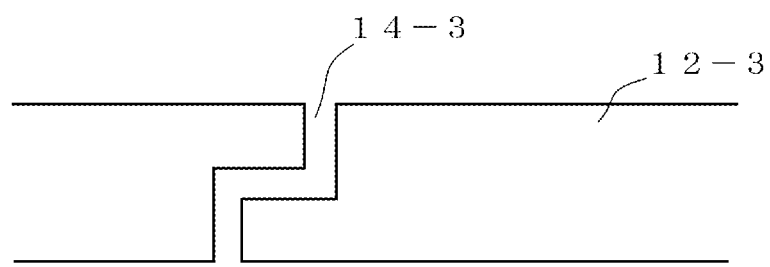
Figure 3D:
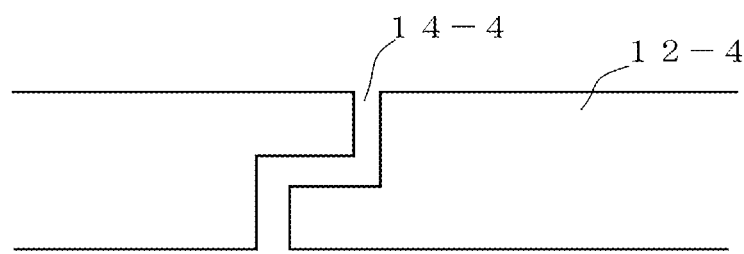

FIG. 2 illustrates a ground conductor structure of the multilayer substrate. This ground conductor structure includes a first ground conductor 12-1, a second ground conductor 12-2, a third ground conductor 12-3, and a fourth ground conductor 12-4. The first ground conductor 12-1 to the fourth ground conductor 12-4 each form the ground conductors 12 of the first to fourth layer circuit patterns L1 to L4 of FIG. 1. Each ground conductor surrounds a corresponding one of the wiring regions 10. On the right far side of the multilayer substrate, a via hole 16 configured to electrically connect the first ground conductor 12-1 to the fourth ground conductor 12-4 together is provided to extend downward from the first ground conductor 12-1 to the fourth ground conductor 12-4 through the second ground conductor 12-2 and the third ground conductor 12-3.

At each of the first ground conductor 12-1 to the fourth ground conductor 12-4, a corresponding one of slits 14-1 to 14-4 is formed as a missing portion connecting between the outside of the multilayer substrate and the wiring region. Each slit has a crank shape. That is, each of the slits 14-1 to 14-4 extends from the wiring region 10 in the near direction (a y-axis negative direction) as viewed in FIG. 2, and then, extends after having bent in the left direction (an x-axis negative direction) as viewed in FIG. 2. Thereafter, such a slit bends in the near direction to extend in the near direction again, and then, reaches the outside of the multilayer substrate.

Note that the slits of adjacent two of the ground conductors are formed at non-overlapping positions, i.e., positions at which a view in the upper-to-lower direction as viewed in FIG. 2 is blocked. Preferably, each slit of the first ground conductor 12-1 to the fourth ground conductor 12-4 is formed at such a position that three ground conductors overlap with each other in such a slit.

FIGS. 3A to 3D each schematically illustrate the positions of the slits formed at the first ground conductor 12-1 to the fourth ground conductor 12-4. These figures illustrate an example where a width is the same among the slits. The slit 14-2 of the second ground conductor 12-2 is formed at a position shifted from the slit 14-1 of the first ground conductor 12-1 to the right side by a distance of equal to or greater than the slit width. The slit 14-3 of the third ground conductor 12-3 is formed at a position shifted from the slit 14-2 of the second ground conductor 12-2 to the right side by a distance of equal to or greater than the slit width. The slit 14-4 of the fourth ground conductor 12-4 is formed at a position shifted from the slit 14-3 of the third ground conductor 12-3 to the right side by a distance of equal to or greater than the slit width.

In the vicinity of each of the slits 14-1 to 14-4, a via hole reaching an adjacent upper or lower one of the ground conductors may be provided. It is more likely that in the vicinity of the crank-shaped slit, the area of the ground conductor is narrower and the impedance of the ground conductor is greater. For this reason, noise might be caused at the electronic circuit mounted on the multilayer substrate, or noise electromagnetic waves might be emitted. In response, the via hole connecting between adjacent two of the ground conductors maybe provided in the vicinity of the slit such that the impedance of the ground conductor in the vicinity of the slit is decreased.

A distance between the slit formed at one of vertically-adjacent two of the ground conductors and the slit formed at the other ground conductor is decreased to such an extent that no via hole (no interlayer connection path) can be provided between these slits. If the via hole is provided between these slits, there is a high probability that short circuit of the slit through adjacent layers occurs due to the via holes provided on both sides of the slit as described later.

Figure 4:
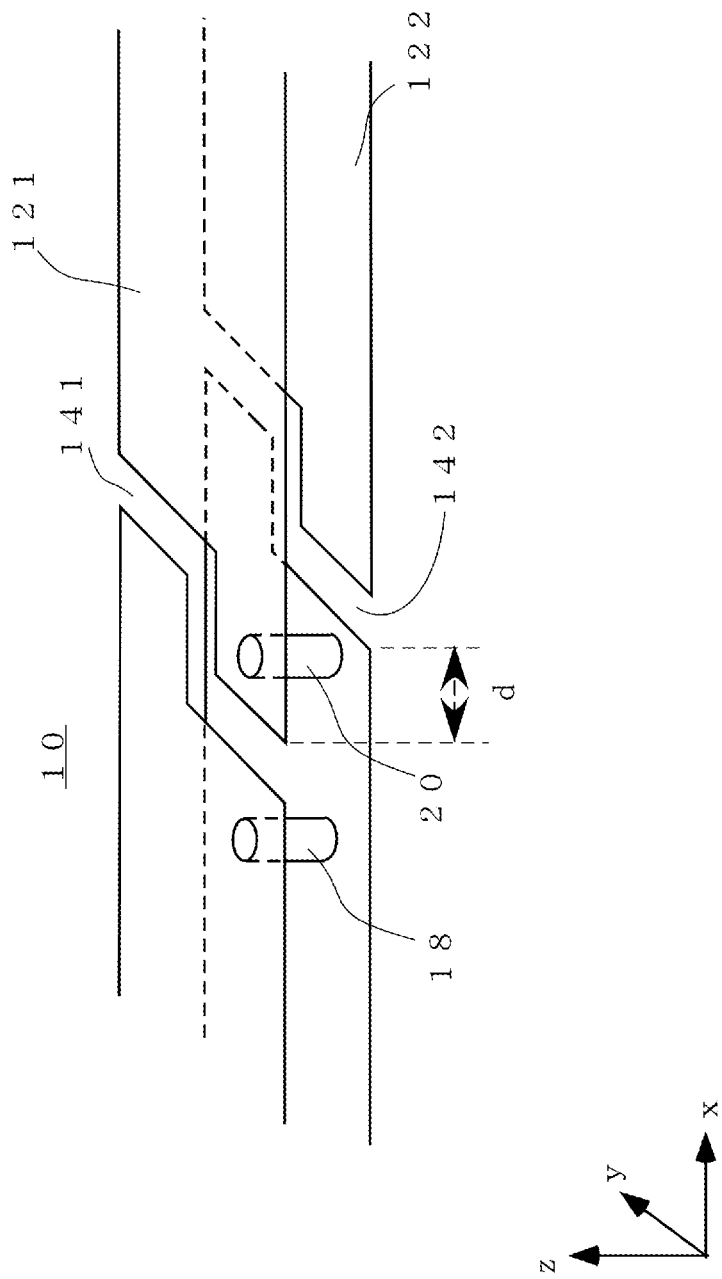
FIG. 4 is a view of a structure in which short circuit of a slit occurs through adjacent layers due to via holes provided on both sides of the slit.

FIG. 4 illustrates an example of a structure in which short circuit of a slit 141 occurs due to two via holes 18, 20. The crank-shaped slit 141 is formed at a j-th ground conductor 121. That is, the slit 141 extends from the wiring region 10 in the near direction (the y-axis negative direction) as viewed in the figure, and then, extends after having bent in the left direction (the x-axis negative direction) as viewed in the figure. Thereafter, the slit 141 bends in the near direction to extend in the near direction again. A slit 142 with the same shape as that of the slit 141 is also formed at a j+1-th ground conductor 122 right below the j-th ground conductor 121. A clearance distance d between the right side of the slit 141 formed at the j-th ground conductor 121 and the left side of the slit 142 formed at the j+1-th ground conductor 122 is sufficient for providing a via hole. The inter-slit clearance distance d described herein is a distance between the projected shapes of the slits 141, 142 when these slits 141, 142 are projected onto an xy plane. A via hole 18 is provided on the left side of the slit 141. A via hole 20 is provided between the slit 141 and the slit 142.

In such a structure, a path is formed, which extends from the j-th ground conductor 121 to the j+1-th ground conductor 122 through the via hole 18 and further extends to the j-th ground conductor 121 through the via hole 20. Thus, short circuit occurs between the right and left sides of the slit 141 of the j-th ground conductor 121, and for this reason, the slit 141 becomes rarely useful.

For avoiding such a problem, it is carefully designed such that no via hole is provided at a position at which short circuit of a slit occurs. However, there is a case where a via hole reaching an upper or lower adjacent ground conductor is desirably provided in the vicinity of a slit.

Thus, the clearance distance between the slit formed at one of vertically-adjacent two of the ground conductors and the slit formed at the other ground conductor is decreased to such an extent that no via hole can be provided between these slits. That is, the slit (the missing portion) of the ground conductor provided at one of adjacent two layers of the circuit patterns and the slit of the ground conductor provided at the other circuit pattern are provided with such a distance that no via hole (no interlayer connection path) can be provided between these two slits. With such a slit proximity structure, short circuit of the slit due to the via holes provided on both sides of the slit is avoided.

Figure 5:
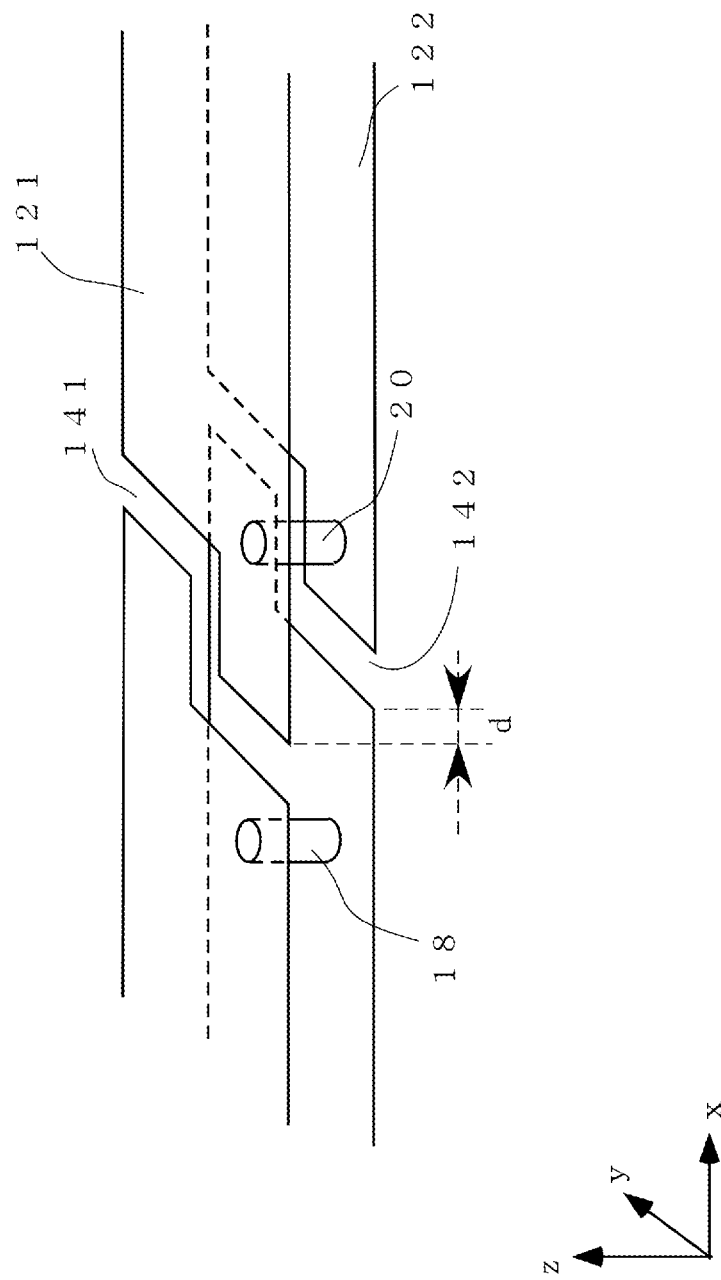
FIG. 5 is a view of an example of a slit proximity structure.

FIG. 5 illustrates an example of the slit proximity structure. The clearance distance d between the right side of the slit 141 and the left side of the slit 142 is shorter than the diameter of the via hole. The via hole 18 provided on the left side of the slit 141 is connected to the left side of the slit 142, and the via hole 20 provided on the right side of the slit 141 is connected to the right side of the slit 142.

As described above, the via hole 20 connecting between the j-th ground conductor 121 and the j+1-th ground conductor 122 is provided in a slit proximity region not sandwiched between the slit 141 of the j-th ground conductor 121 and the slit 142 of the j+1-th ground conductor 122.

A path from the j-th ground conductor 121 to the j+1-th ground conductor 122 through the via hole 18 and a path from the j-th ground conductor 121 to the j+1-th ground conductor 122 through the via hole 20 are insulated from each other by the slit 142 provided at the j+1-th ground conductor 122. With this configuration, short circuit of the slit 141 provided at the j-th ground conductor 121 is avoided.

According to the multilayer substrate of the embodiment of the present invention, the wiring region in each circuit pattern is surrounded by the ground conductor, and the conductive wiring pattern connecting among the electronic components is surrounded by the ground conductor. With this configuration, each electronic component is protected from static electricity. Moreover, the ground conductor of each layer is provided with the slit connecting between the outside of the multilayer substrate and the wiring region. Thus, the ground conductor does not form a loop, and therefore, less noise current due to electromagnetic waves from the outside of the multilayer substrate flows through the ground conductor.

Further, the slits of adjacent two of the ground conductors are formed at such positions that the view from one side to the other side is blocked. Moreover, each slit has such a shape that a view from an end side of the multilayer substrate to a wiring region side is blocked, such as the crank shape. This maintains the effect of protecting each electronic component from static electricity even when the slits are provided.

The multilayer substrate of the embodiment of the present invention may be also used as a substrate on which an audio circuit of a mobile information terminal such as a smartphone or a tablet computer is mounted. These mobile information terminals often include wireless circuits according to standards such as WiFi, WiMAX, and Bluetooth. In general, electromagnetic waves with various frequencies are emitted from the wireless circuit. This might lead to noise voltage or noise current at the audio circuit. The ground conductor of the multilayer substrate of the present embodiment has such a structure that less noise is caused, and noise output from the audio circuit is reduced.

Figure 6:
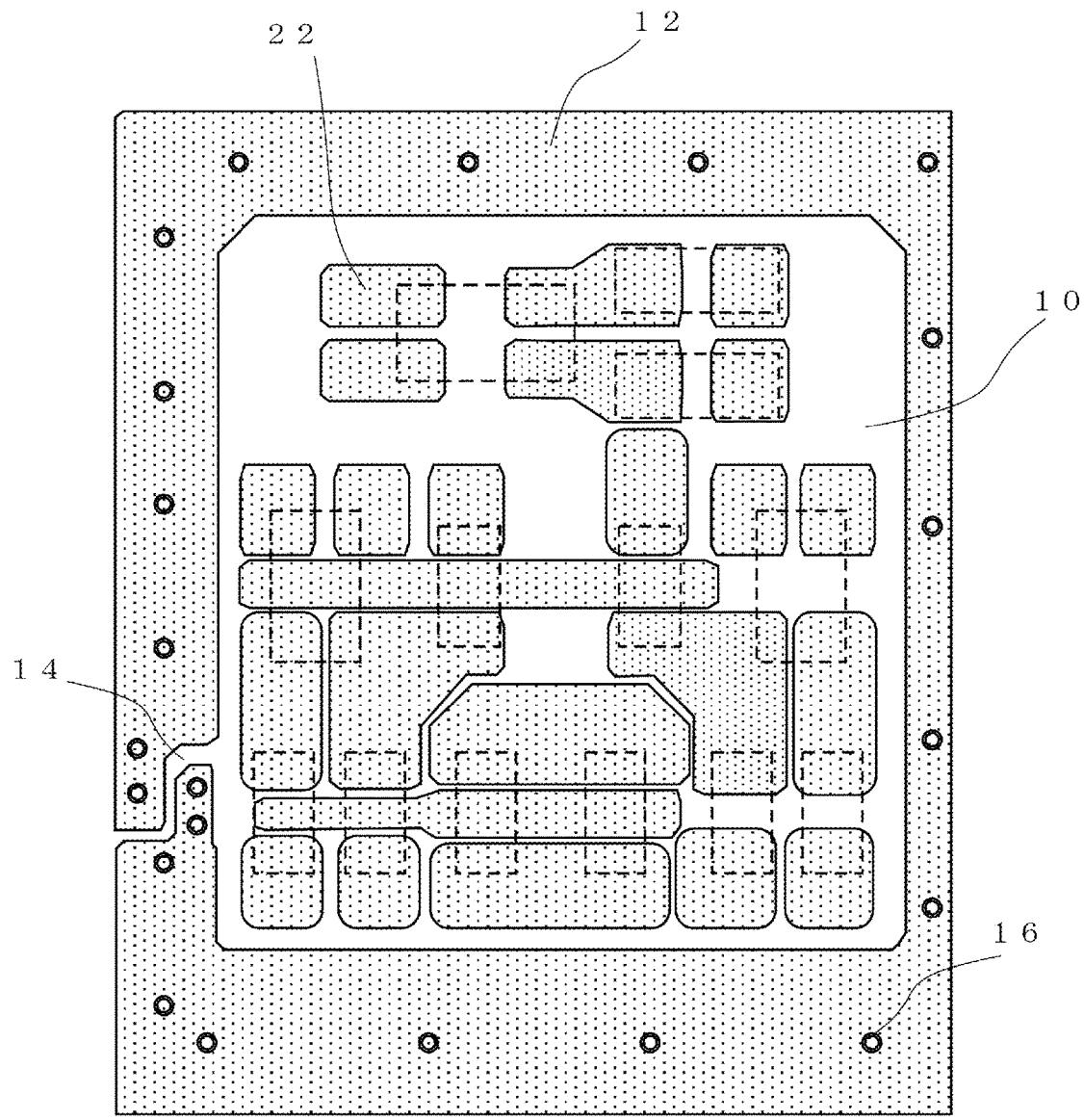
FIG. 6 is a view of an example of a circuit pattern of the uppermost layer of the multilayer substrate.

FIG. 6 illustrates an example of the circuit pattern of the uppermost layer of the multilayer substrate. Dashed lines in the figure indicate regions where the electronic components are arranged. The ground conductor 12 surrounds the wiring region 10, and is provided with the crank-shaped slit 14. In the vicinity of the slit 14, the via holes are provided at intervals shorter than that in other regions. Pads 22 to which terminals of the electronic components are soldered are formed on a surface of the wiring region 10. Each pad 22 may be, through a via hole, connected to the conductive wiring pattern in the wiring region of the second layer or lower.

The embodiment in which the crank-shaped slit is formed at each ground conductor has been described above. The slit may have other shapes in which the view from the end side of the multilayer substrate to the wiring region side is blocked. For example, as illustrated in FIG. 7, a slit 24 connecting between the outside of the multilayer substrate and the wiring region 10 may be, at the ground conductor 12 surrounding the wiring region 10 in a rectangular pattern, provided to extend diagonally to an outer edge of the ground conductor 12. The opening position of the slit 24 facing the wiring region 10 and the opening position of the slit 24 facing the outside of the multilayer substrate are shifted from each other in a right-to-left direction by a distance of equal to or greater than the width of the slit 24, and therefore, the view from the end side of the multilayer substrate toward the wiring region 10 is blocked. As indicated by the dashed lines, the lower ground conductors are formed in a similar shape. Thus, influence of static charge in a multilayer substrate end surface direction is reduced.

The multilayer substrate with the four-layer structure has been described above. The present invention may be used for a multi layer substrate having two layers, three layers, or five or more layers. Note that the following structure may be employed: a single insulator layer is provided below the circuit pattern of the lowermost layer, and therefore, not the circuit pattern but a lower surface of the insulator layer is exposed at a lower surface of the multilayer substrate.

What is claimed is:

1. A multilayer substrate with plural layers of circuit patterns, comprising:
    a ground conductor provided at each circuit pattern and surrounding a wiring region provided with a conductive wiring pattern; and
    a missing portion provided at the ground conductor of each circuit pattern and connecting between an outside of the multilayer substrate and the wiring region,
    wherein the missing portion of the ground conductor provided at one of adjacent two layers of the circuit patterns and the missing portion of the ground conductor provided at the other layer are formed at positions not overlapping with each other.

2. The multilayer substrate according to claim 1, wherein the missing portion of the ground conductor provided at on of adjacent two layers of the circuit patterns and the missing portion of the ground conductor provided at the other layer are provided with such a distance that no interlayer connection path is provided between the missing portions.

3. The multilayer substrate according to claim 1, further comprising:
    an interlayer connection path provided in a region in a vicinity of the missing portion of each ground conductor, the region being not sandwiched between the missing portion of the ground conductor provided at one of adjacent two layers of the circuit patterns and the missing portion of the ground conductor provided at the other layer.

4. The multilayer substrate according to claim 1, wherein a shape of the missing portion of the ground conductor provided at each circuit pattern is such a shape that a view from an end side of the multilayer substrate to a wiring region side is blocked.

* * * * *